United States Patent [19]

Moynagh

[11] Patent Number: 4,782,273
[45] Date of Patent: Nov. 1, 1988

[54] AUTOMATIC PART LOCATION AND MECHANICAL TESTING OF PART INSERTION

[75] Inventor: Kelan T. Moynagh, Huntsville, Ala.

[73] Assignee: Control Data Corporation, Minneapolis, Minn.

[21] Appl. No.: 894,546

[22] Filed: Aug. 8, 1986

[51] Int. Cl.$^4$ ............................................. H05K 3/32
[52] U.S. Cl. ..................................... 318/568; 29/739; 29/833
[58] Field of Search ...................... 318/568, 640, 480; 29/700, 709, 739, 729, 759, 825, 829, 832, 833, 837, 846, 745, 755; 364/478, 468, 513; 901/46, 47

[56] References Cited

U.S. PATENT DOCUMENTS

| | | | |
|---|---|---|---|
| 3,706,134 | 12/1972 | Sweeney et al. | 29/833 |
| 3,852,865 | 12/1974 | Ragard | 29/739 X |
| 3,932,931 | 1/1976 | Wright | 29/739 X |
| 4,218,745 | 8/1980 | Perkins | 364/489 |
| 4,232,335 | 11/1980 | Nakagawa et al. | 350/508 X |
| 4,271,573 | 6/1981 | von Roesgen | 29/739 X |
| 4,342,090 | 7/1982 | Caccoma | 29/759 X |
| 4,573,261 | 3/1986 | Honda et al. | 29/701 |
| 4,639,878 | 1/1987 | Day et al. | 901/47 X |

FOREIGN PATENT DOCUMENTS 0651168 8/1985 Switzerland ....................... 29/833

OTHER PUBLICATIONS

McPherson, D. E. and A. S. Plech. "Printed Circuit Card Component Assembly Apparatus", IBM Tech. Disclosure Bulletin vol. 20, No. 12, 5-1978 pp. 5091-5092.

*Primary Examiner*—Bentsu Ro
*Attorney, Agent, or Firm*—Joseph A. Genovese; Michael B. Atlass

[57] ABSTRACT

This invention provides for a method and apparatus for assembly of complex systems by human operators with the assistance of automatic machinery. The machinery employs a lighted probe to direct the operator to insert a part of the lighted location and the machinery tests for proper seating of the part. The machinery is integrated into a larger automated system which enhances its automatic part location indicating function by allowing and correcting for mislocation of real world coordinates from ideal coordinates. Also taught is a method for integration fo the assembly operation from the design stage through the production phase.

4 Claims, 4 Drawing Sheets

AUTOMATIC PART LOCATION AND MECHANICAL TESTING OF PART INSERTION

This invention relates to the field of assembly processes and is of particular use in the field of wiring complex panels where location and insertion of many wires (or cables) must be accomplished precisely. In the general case, this invention may be applied to insertion of any complex set of parts into precise locations, particularly where they are to be inserted into a single planar surface.

BACKGROUND

In the design of large, complex computing or other electronic systems, a large number of printed circuit or other logic chip containing boards must be tied together electrically, and because the routing of various circuits from one bus board to the next may be quite complex, a chassis full of boards may need to be covered with a thick mat of interconnecting wires. Due to timing considerations and other constraints, the lengths of at least some of these wires must be precisely controlled. While at some unspecified time in the future such mats of wires may be eliminated by large scale printed circuit bus board interconnections and intraconnections (or other means), at the present time they are a necessary evil. Currently, the design team will specify the connections and lengths of wire between every two connections, and, prior to this invention, an assembly person would look from his sheets of connection specifications (coded for him by the design team) to the chassis, find the correct wire, insert the correct wire into the location, memorialize his accomplishment by writing on the sheet of connections and proceed to the next. Where thousands upon thousands of connections go into each matrix of bus boards, it is common to find some errors.

Typically, when not using this invention, after each 500-1000 wires are inserted, two operators will work cooperatively to inspect the job. They will use an overlay to see if the holes are filled and a push tester probe to see if each connection is tight. Then, operating from the unwired and unmatted side of the chassis, one operator may orally recite the proper origin and destination of a wire, while the other checks for electrical continuity between the stated locations. A "buzz box" is commonly used which emits a buzzing sound when an electrical connection is made between two locations. Thus, proper "buzzing" locates where ends of wires are supposed to be positioned and double checks electrical continuity of the wire. Still, once the buzzing has been finished, a considerable amount of work remains in correcting the errors. All in all, buzzing requires about 16% of the production time including the assembly time for inserting and esting the connections.

Despite the buzzing, 0.024% of the connections made by hand were found to be errors out of all the connections made on seven (7) super computer systems studied. Whether the errors are due to misplaced or improperly seated wires, detection and location of errors takes over (3) hours at the testing stage. Additionally, disassembly and correction of the error can take up to an additional half hour. Thus, hand work causes additional costs to be imposed by errors and increased throughput times, larger inventory costs and additional labor hours dedicated to rework. Using this invention, if continuity of the cables used for interconnections is assured before their insertion/assembly into the bus boards, the entire process of buzzing can be eliminated because the occurrence of insertion and location error becomes negligible.

Human operators/assemblers are still necessary for such operations since, as yet, robot systems have not been developed which can part a nest or mat of wires to find the correct empty insertion point or hole, then squeeze the wire through to successfully make the connection/insertion. However, a robot can guide the human operator to the proper insertion location and test to make sure that the insertion was made properly.

Three patents are incorporated herein by reference

One is U.S. Pat. No. 4,573,261 issued to Honda, et al, which shows that correspondence between location of an actuating means (assembling head) and a part location (determined by its fixation to a table) can be used in automatic assembly. It does not deal with the problems described above nor allow human assembly during its operation, nor does it allow inappropriate real-world mislocations (in other words, alignment is not readjustable where a part location within a given area may be off its proper location).

The second incorporated patent is U.S. Pat. No. 4,277,831, Saunders, et al, showing human operator interface in assembly operations with the robotic/computer system checking operator faults. In Saunders, the human operator must find the location for a connection himself and after the connection is made the invention tests the connection electrically.

Also incorporated by reference is U.S. Pat. No. 4,510,683, which describes one method for building a bi-directional actuatable slider member with programmably controllable insertion force.

SUMMARY OF THE INVENTION

In sum, the invention provides a system of parts and processes to enable a human operator to accomplish tasks similar to the task described for the preferred embodiment. The preferred embodiment includes a computerized data base of connection locations which is loaded with wiring information including location of the wire onto each bus board, its location off that bus board (whether on the chassis or off), and the type and/or length of wire. The computer data base may also record each successful connection/insertion of a wire end as reported by the robot arm and then instruct the operator which oonnection to make next. The robot arm is directed by the information in the data base to indicate (in the preferred embodiment by means of a light inserted into the proper hole) the location to be wired. Disclosed also is a method for confirming the internal robotic location system to the real world of bus boards and the chassis by using two known points on each bus board and a vision processing system. Another novel feature of this invention provides for the establishment of a data base directly from the designer's specifications without human intervention.

DETAILED DESCRIPTION OF THE PREFERRED EMBODIMENT

Figure 1:
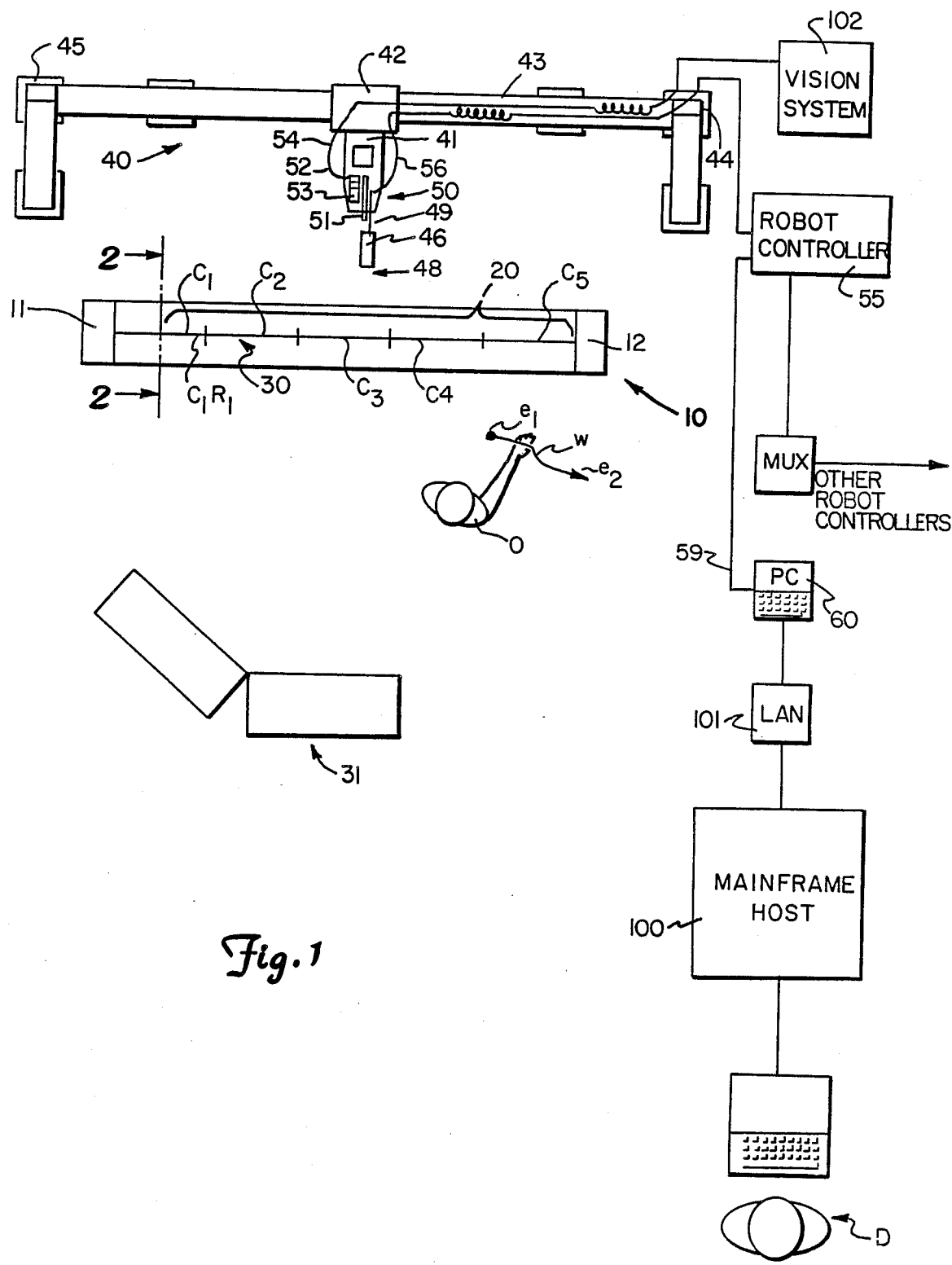
FIG. 1 is a schematic diagram of the system components used in the preferred embodiment.

Referring first to FIG. 1 in which a top view of the components is shown, the preferred embodiment is described functionally with respect to a mainframe or super computer chassis 10 including support structures 11 and 12 and a cooling and power supply bay in the base 30 (not detailed). The bus board matrix itself is designated with the numeral 20, and from a top view is seen to be comprised of five columns of boards, $C_1$ through $C_5$.

The components of the system can be said to include elements outside the assembly stage of production and all the way back to the design phase when the invention is looked at in its broadest sense. Described as such, a designer D specifies the necessary connections from circuit elements within each bus board or from one bus board to another or from the bus board matrix to off the bus board matrix by cable with the design assistance capabilities of the mainframe host 100. This list of connections, depending on the capabilities of the design assistance software may be translated into specific locations and the design then simulated within the mainframe host to check for errors. The resulting compiled list, including wire locations, lengths of wires and types of wires, can then be sorted into a data base of wire lists which assist in the assembly process by their logical delineation and internal order. In the preferred embodiment, this data base is provided to a local area network 101 by direct linkage to the mainframe host. The operator O may interact with the micro computer on PC 60 to call for a specific wire list out of the data base. The wire lists may be segmented by wire size, for instance, so that at the end of a wire size sequence, the operator would move on to the next wire size, thus limiting the chances that the wrong sized wire might be used to make a connection. The PC 60 contains a program to forward each wire location to the robot controller 55, either as a set of locations for an entire wire list or one at a time, depending on the intelligence of the robot controller. The robot controller 55 positions the robot arm assembly 40 to bring the lighted probe 48 to the correct location. Because the real world location of the particular bus board within the robot's working envelope may vary slightly from where they would be in a perfect world, a correction system is provided including a camera 52 linked to a vision system interpreter 102 and a program for shifting the coordinates accordingly, which may be resident in the robot controller 55 or the PC 60, depending on the implementation. A multiplexer 103 may be provided to share the vision system resources with other robots and/or PC's on an assembly floor.

A human operator O is shown holding a wire W, taken from the supply cabinet 31 which contains an appropriately stocked, precut and measured supply of appropriate wires or cables having connector ends (like $e_1$ and $e_2$) These wires or cables may also be segregated into clocking cables of exacting lengths and off-chassis cables as well as the inter and intra bus board cables.

The robotic arm mechanism 50 is supported by a base 41 connected to a telescoping column 42 supported at the top by a crossbeam 43, which in turn is held in place at ends 44 and 45. The preferred embodiment robot arm assembly 40 and the robot controller 55 actually in use by the inventor may be obtained through GCA Corporation of St. Paul. Whatever system is used, the accuracy of movement within a plane parallel to that of the bus board matrix must be sufficient to place the effector end of probe to within a functional distance of the exact planar center of any desired location in its working envelope.

Figure 2:
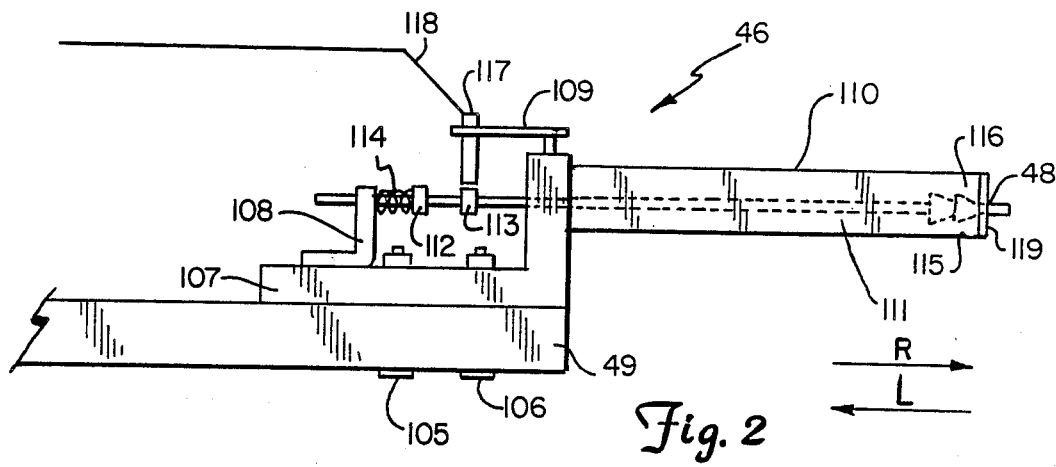
FIG. 2 is a view of the end effector mechanism of the preferred embodiment mounted on a bar member.

The end effector mechanism 46 is described in detail with reference to FIGS. 2 and 3. The mechanism 46 is mounted on a bar or rod 49 by means of bolts 105 and 106 or by other means to effect solid immoveable contact there between. Bracket 107 supports, by its solid immoveable connection therewith, bracket 108, bracket 109 and hollow tube member 110. Bracket 107 and 108 have holes bored in them to allow the smooth passage of rod 111 through both said holes. To rod 111 are affixed two metal collars, 112 and 113; collar 112 supporting a spring 114 between itself and bracket 108 biasing rod 111 with two pounds of force in direction R. This biasing of rod 111 in direction R forces end effector probe 48 against the far sealed end of tube 110, tip end 115. A light 116 is provided between the end of rod 111 and the effector end 48 to constantly light probe 48. If effector end probe 48 is moved in the direction L (vis-a-vis tip 115) the position sensor 117 (supported by bracket 109) sends a constant signal (or continues not to send a current) across wire 118 to the robot controller 55 to indicate a retracted position. For the purposes of the preferred embodiment, the strength of spring 114 is approximately 2 pounds.

Figure 3:
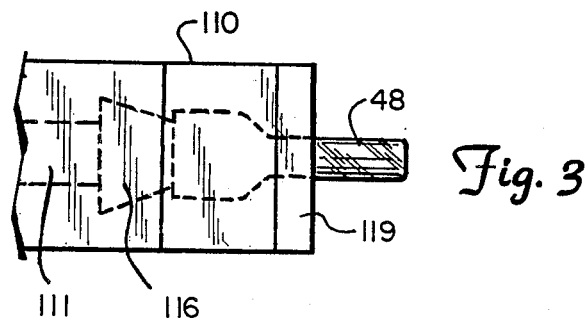
FIG. 3 is a view of the tip of the end effector of FIG. 2.

Referring now to FIG. 3, in which the detail of the end of tube 110 is shown, the probe 48 is a clear plastic body supported on rod 111 by the light 116 mounted there between. A rubber cushion 119 is also provided to avoid metallic contact with the bus board on insertion of the probe 48 and to cushion the bus board against the impact of the hard tip 115.

In the preferred embodiment the bar 49 is mounted on a pneumatic assembly and slide mechanism 51 (see FIG. 1). This mechanism 51 drives the probe toward the bus board or retracts it and merely functions between two positions. Sensors at each end of the slide may be provided to indicate fully retracted and fully extended positions of the bar 49. Since the position between the robot arm mechanism 40 and the plane in which the bus boards matrix is located are known with precision, these two slide positions will suffice. Also, it will be clear to one of ordinary skill in the art that many other mechanical means aside from the pneumatically operated slide bar arrangement described herein, could be used to drive the probe between a retracted and full extended position. Likewise, other means of effecting similar motion may be adopted as for example be that shown in U.S. Pat. No. 4,510,683.

Likewise, pressure sensor information may be derived by means other than the collar 113 and the proximity sensor 117 as will be apparent to one of ordinary skill in the art.

Referring back to FIG. 1, a video camera 52 and lens 53 are also mounted on the base 41. (Power cables are not shown.) Video information is transmitted via cable 54 to vision processor 102 and pressure sensor information and effector motor control information are transmitted via cable 56 between the controller 55 and slide and bar pneumatic assembly 50. A cable 59 connects the computer or terminal 60 to the controller 55. The vision processor 102 and robot controller 55 are connected via multiplexer 103. It is up to the system designer where to place the computational power, but in the preferred embodiment the computer 60 is a personal-type or microcomputer having the wiring data base and location of connection information stored in an accessable local area network server 101 and the PC 60 is capable of instructing the controller 55 to move to the next symbolic location, and is also capable of communicating to the human 0 that it needs the next wire file, that a system error condition exists or the hole position or other pertinent information.

Figure 4:
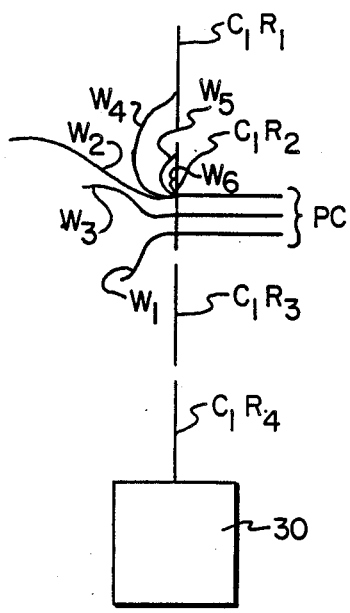
FIG. 4 is a side view cut through a bus board matrix.

Referring now to FIG. 4 in which the chassis is shown, sectioned through the first column $C_1$, it can be seen to be comprised of four bus boards, $C_1R_1$, $C_1R_2$, $C_1R_3$ and $C_1R_4$ "sitting" on a cooling and power base 30 (structural and power and cooling means not shown). Printed circuit boards PC are shown mounted as they may be after the wiring of the chassis is accomplished. Lines $W_1$ through $W_6$ are also shown, for illustration purposes only.

Figure 5:
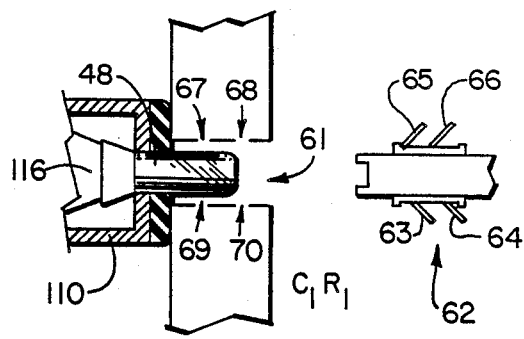
FIG. 5 illustrates the insertion plug in use with the preferred embodiment and the hole in the board into which it may be inserted, as well as the position of the tip of the effector end of the robot arm vis-a-vis said hole.

Connection to the bus boards of the wires is illustrated with reference to FIG. 5 in which a piece of board $C_1R_1$ is shown with hole 61 therein. The connector 62 has barbs 63, 64, 65, 66 which fasten it on insertion to recesses 67, 68, 69, 70.

The lighted probe 48 enters the hole from the opposite side to indicate to the operator into which hole the insertion is to go and it is pushed back when the connection is made. This pushing back of the probe (at or with greater than 2 lbs. force) signals the robot arm (via the controller) to wait for a test of seating. In the preferred embodiment the probe then pushes back with its 2 lbs of spring force to ensure that the insertion is successful and if it is able to unseat the part or wire end, it causes a signal to go to the human operator to retry (via the microcomputer or other signal means).

Location of the holes by the robot arm is now described with reference to FIG. 6 in which a bus board $C_1R_1$ is shown with holes 0,0; 0,1, 0,2; 0,3; 0,4; 1,0; 1,1; 1,2 .... If exacting placement of the parts is required, an exact bearing needs to be taken on the location of each bus board and this is found by visual (via the video camera) location of reference holes $L_l$, $L_2$ and a hole location $L_3$ which may be computed from them.

To accomplish accurate locations of the probe the system must locate the exact locations of each reference hole to calculate the offset or rotation of each bus board from its ideal location. Mislocation could cause damage to the bus boards or misinsertion or prevent the system from operating as described.

The position of the vision's system's field of view (and each pixel or area in it) is known (and in the preferred embodiment, immovable) with respect to the probe's location in a Y-Z plane (coplanar with the bus board matrix) and it is also known where the probe is in the field of the working envelope to the tolerance of the robot arm assembly. Therefore the location of the found reference hole is known by the location of the pixel on which its reference point is found, so the distance in Y and Z from its idealized location can be computed.

Based on the real location of any two reference holes in the robot coordinate system, the exact location of all holes in that bus board can be computed if their relative locations within the board are known.

Figure 8:
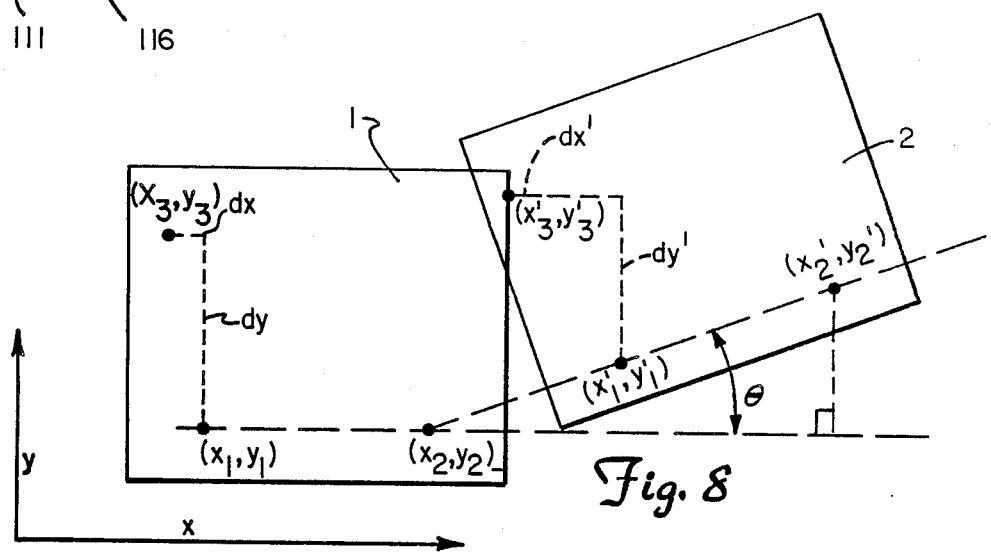
FIG. 8 is an heuristic illustration of two bus board panels.

For one explanation, refer to FIG. 8 in which are shown two small bus boards, 1 and 2, in which bus board 1 represents the ideal location of that bus board in the x-y coordinate system and bus board 2 represents the position of an actual bus board in the real world. The vision system will locate the two reference points or holes at $(x_1', y_1')$ and $(x_2', y_2')$ for the bus board, corresponding to points $(x_1, y_1)$ and $(x_2, y_2)$, respectively in the idealized or original, (exactly correctly positioned) panel (bus board 1). The position of the hole or point where the robot's probe needs to go to reach a point in the idealized panel $(x_3, y_3)$ is actually positioned at $(x_3', y_3')$. The correspondence can be calculated as follows:

Since $$\theta = \tan^{-1}\frac{(y_2' - y_1')}{(x_2' - x_1')},$$

and $dx = x_3 - x_1$, and $dy = y_3 - y_1$ by matrix multiplication then, $$[dx', dy'] = [dx, dy]\begin{bmatrix} \cos\theta, & \sin\theta \\ -\sin\theta, & \cos\theta \end{bmatrix}$$

therefore $x_3' = x_1' + dx'$ and $y_3' = y_1' + dy'$.

Now, if the robot moves (the probe) to its coordinates $(x_3', y_3')$ it will find the hole sought. Of course, the camera's pixel offset from the reference hole or point is assumed to be compensated for. And it should be obvious that the line defined by $(x_1, y_1)$, $(x_2, y_2)$ is in a line parallel to the x coordinate axis of the robot coordinate system. Other methods for computing the relative locations of insertion holes can easily be contrived once the deviation of two reference holes is determined by their location using the vision system.

Figure 6:
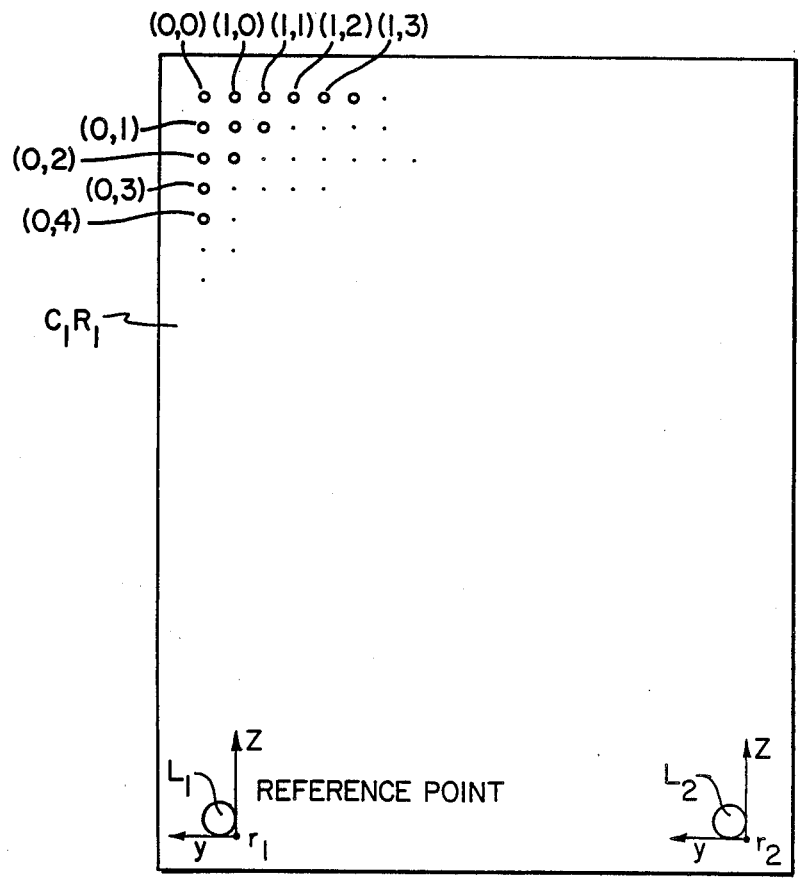
FIG. 6 is a frontal view of a portion of one of the bus boards illustrating the reference holes and insertion holes.

Refer to FIG. 6. To determine the exact location of a reference hole it has been found that one may use the pixel which corresponds to a reference point R1 (or R2), being the points of intersection of two tangent lines parallel to the Y and Z axes at a given corner of the hole, in this example the lower right corner of the reference holes.

It has been found that the APP Model 200 vision recognition system available through Pattern Processing Technology of Minneapolis, provides adequate signal processing capabilities to locate a reference hole and corresponding reference point pixel as described above because it can provide an image from which tangent lines can be found and their intersections and because it can distinguish a reference hole from a surrounding flat surface containing other, smaller holes. Similar characteristics should be incorporated in any vision system using the teachings of this invention. It has been found that covering the reference hole area with white tape or paint or other surfacing provides additional contrast to enable the system to recognize the reference hole more easily.

In the preferred embodiment, all the reference holes are located first and deviations required for location of the probe 48 into any given hole on any given bus board is computed. The correct location within the robot arm mechanisms working envelope is then computed for each hole location, so that the robot controller 55 can drive the robot arm mechanism to the appropriate location.

Figure 7:
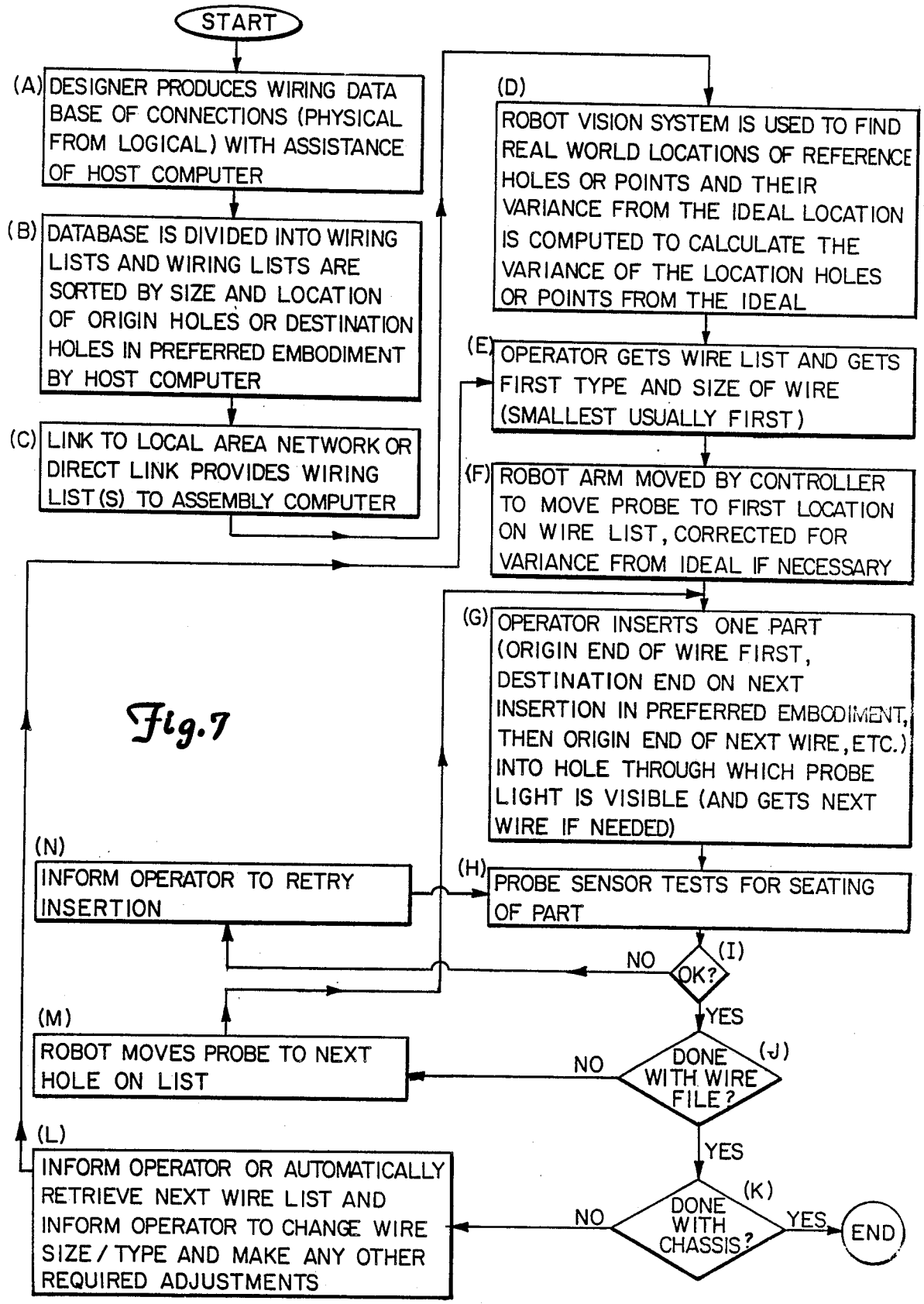
FIG. 7 is a flow chart showing how the process of part or wire insertion may be accomplished in accord with the teachings of this invention.

Thus, in general terms, the wiring process can be described with reference to FIG. 7, which is self-explanatory.

What is claimed is:

1. A method for inserting parts into predetermined hole locations on a substantially planar structure, such that each particular part may be mated to each particular location identifiable by particular part location data, until all the parts are mated to their predetermined locations, comprising at least the steps:
   (a) sending the location data for a part location to an automatic positioning mechanism equipped with a lighted probe and being located on one side of said substantially planar structure,
   (b) automatically moving said lighted probe to said part location indicated by the location data from step "a",
   (c) pushing said probe into said location such that the light of said probe may be visible to an operator on the other side of said planar structure,
   (d) inserting said part into said location by said operator with force sufficient to push said lighted probe backward from said planar structure,
   (e) release by said operator of said part,
   (f) testing the seating of said part in said location by attempting insertion of said probe,
   (g) if the part is improperly seated, signalling the operator to correct, then trying again by repeating this method starting at step "c", unless the probe is already inserted in which case then start at step "d" otherwise, if part is properly seated going to step "h",
   (h) querying whether all parts have been inserted; if so signal the operator to do next task, else,
   (i) go to step "a"

2. The product of the method for inserting parts into predetermined hole locations on a substantially planar structure, such that each particular part may be mated to each particular location identifiable by particular part location data until all the parts are mated to their predetermined locations, comprising at least the steps:
   (a) sending the location data for a part location to an automatic positioning mechanism equipped with a lighted probe and being located on one side of said substantially planar structure,
   (b) automatically moving said lighted probe to said part location indicated by the location data from step "a",
   (c) pushing said probe into said location such that the light of said probe may be visible to an operator on the other side of said planar structure,
   (d) inserting said part into said location by said operator with force sufficient to push said lighted probe backward from said planar structure,
   (e) release by said operator of said part,
   (f) testing the seating of said part in said location by attempting insertion of said probe,
   (g) if the part is improperly seated, signalling the operator to correct, then trying again by repeating this method starting at step "c" unless the probe is already inserted in which case then start at step "d", otherwise, if part is properly seated going to step "h",
   (h) querying whether all parts have been inserted; if so, signal operator to do next task, else,
   (i) go to step "a".

3. An integrated computer-aided wiring assembly method for wiring a substantially planar structure employing a set of automated equipment including a host computer, an assembly computer, and a controller, wherein the host computer is for use by a designer to develop a wiring scheme for the interconnections necessary to connect circuits on bus boards in bus board matrix and to compile the wiring scheme into wiring lists wherein each wire has a designated type and size and a sesignated hole location for each end and wherein the wiring list is accessible by said assembly computer capable fo tracking wiring progress and delivering wiring list information to an operator and to an automatic positioning apparatus wherein said automatic positioning apparatus is controlled by said controller for delivering a lighted probe to a designated hole location in said planar structure in such a form that said apparatus and assembly computer can interpret the information as pairs designated hole locations in its operating envelope; wherein the method includes the steps
   (a) producing, with the assistance of said host computer a wiring data base of connections including the physical locations for insertion, lengths, and types of wires to be inserted therein,
   (b) dividing said data base into wiring lists and sorting each said wiring list within the host computer,
   (c) providing the wiring lists to the assembly computer,
   (d) the operator gets indicated type and size of wire required by the wiring lists,
   (e) the automatic positioning apparatus moves the lighted probe to the designated location on the wiring list,
   (f) the operator inserts designated wire end into hold through which probe light is visible and gets next wire or wire end, if needed,
   (g) lighted probe tests for the seating of said wire end,
   (h) if the wire end is improperly seated, the operator to correct, then go to step "g", else move the probe to the next hole on list, then repeat from step "f",
   (j) if done with bus board matrix then stop else, inform the operator to, or automatically retrieve next wire list and inform the operator to change wire size and type and make any other required adjustments then repeat from step "d".

4. A computer-aided assembly method for placing parts in a substantially planar structure employing a set of automated equipment including an assembly computer, and a controller, wherein a list of designated parts and designated locations for them in said planar structure is developed by a designer wherein said list is accessible by said assembly computer capable of tracking assembly progress and delivering list information to an automatic positioning apparatus wherein said automatic positioning apparatus is controlled by said controller for delivering a lighted probe to a given hole location in said planar structure in such a form that said apparatus and assembly computer can interpret the information as pairs of designated hole locations in its operating envelope; wherein the method includes the steps:
   (a) an operator gets a designated part as required by the part list, (b) the automatic positioning apparatus moves the lighted probe to the first location on the part list,
(c) the operator inserts appropriate part into hole through which probe light is visible and gets next part, if needed,
(d) lighted probe tests for the seating of the part,
(e) if the part is improperly seated, the operator is to correct, then go to step "d", else move probe to the next hole on list, then, repeat from step "c",
(f) if done with structure then stop, else, inform the operator to, or automatically retrieve, next part list and inform the operator to make any required adjustments then repeat from step "d".

* * * * *